(12) United States Patent
Kwon et al.

(10) Patent No.: US 7,652,264 B2
(45) Date of Patent: Jan. 26, 2010

(54) FILAMENT MEMBER, ION SOURCE, AND ION IMPLANTATION APPARATUS

(75) Inventors: Ui-Hui Kwon, Hwaseong-si (KR); Tai-Kyung Kim, Anyang-si (KR); Gyeong-Su Keum, Suwon-si (KR); Won-Young Chung, Hwaseong-si Gyeonggi-do (KR); Kwang-Ho Cha, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 634 days.

(21) Appl. No.: 11/544,595

(22) Filed: Oct. 10, 2006

(65) Prior Publication Data

US 2007/0114435 A1    May 24, 2007

(30) Foreign Application Priority Data

Oct. 7, 2005   (KR) .................. 10-2005-0094486

(51) Int. Cl.
*H01T 23/00*  (2006.01)
(52) U.S. Cl. .................. 250/423 F; 313/250; 313/310
(58) Field of Classification Search .............. 250/423 F
See application file for complete search history.

(56) References Cited

U.S. PATENT DOCUMENTS

| 3,701,919 A | * | 10/1972 | Geppert ................. 313/250 |
| 4,827,177 A | * | 5/1989 | Lee et al. ................. 313/306 |
| 6,204,508 B1 | | 3/2001 | Chen et al. |

FOREIGN PATENT DOCUMENTS

| JP | 60-0068617 | 4/1985 |
| JP | 06-325686 | 11/1994 |
| JP | 1998-0018027 | 1/1998 |
| JP | 10-172448 | 6/1998 |
| KR | 10-1998-0030957 | 7/1998 |
| KR | 10-2000-0017070 | 3/2000 |
| KR | 20-0271808 | 3/2002 |

* cited by examiner

*Primary Examiner*—David A. Vanore
*Assistant Examiner*—Phillip A. Johnston
(74) *Attorney, Agent, or Firm*—Harness, Dickey & Pierce

(57) ABSTRACT

A filament member configured to discharge thermions may be employed in an ion source of an ion implantation apparatus. A filament member may include an anode disposed around a central portion of the filament member, a cathode disposed around a periphery of the filament and/or enclosing the anode, and at least one conductive path disposed between the anode and the cathode to discharge the thermions.

17 Claims, 9 Drawing Sheets

FILAMENT MEMBER, ION SOURCE, AND ION IMPLANTATION APPARATUS

PRIORITY CLAIM

A claim of priority is made under 35 U.S.C. § 119 to Korean Patent Application 2005-94486 filed on Oct. 7, 2005, the entire contents of which are hereby incorporated by reference.

BACKGROUND

Example embodiments disclosed herein may relate to apparatuses for use in fabricating semiconductor devices. In particular, example embodiments disclosed herein may relate to a filament member, an ion source and an ion implantation apparatus.

Ion implantation is a process of injecting impurities, for example, P-type or N-type impurities, for example boron (B), aluminum (Al), and indium (In), or, antimony (Sb), phosphorous (P), and arsenic (As), which may be controlled in a plasma ionic condition, into a pure silicon (Si) wafer to produce a device with required conductivity and resistivity. Ion implantation techniques have been widely used to manufacture semiconductor devices, because controlling the concentration of impurities injected into a wafer may be easier.

An apparatus used for ion implantation may have an ion source for generating ion beams. FIG. 1 is a sectional view schematically illustrating a conventional ion source 900. Referring to FIG. 1, the ion source 900 may have an arc chamber 920 including a port 922 for introducing source gas thereinto and an ion beam outlet 924 through which ions, for example, positive ions may be supplied thereinto. The arc chamber 920 may contain a filament 940 for emitting thermions. When connected with a power supply, the filament 940 may heat to a desired temperature to emit electrons. The emitted electrons may collide with gas molecules in the arc chamber 920 to ionize the gas molecules. During this process, gaseous plasma with various ions and electrons may be generated. The generated ions may be emitted through the ion beam outlet 924 and implanted into a wafer.

The filament 940 may be coiled as illustrated in FIG. 1. Each end of the filament 940 may be connected to a cathode and an anode. Current may flow from the anode to the cathode through the filament 940. When current flows, a thermionic current induced at a middle of the filament 940 may cause the filament current to be larger nearer to the cathode than the anode. As a result, the amount of hot electron emission may become unbalanced over the filament 940, wherein more thermions may be emitted near the cathode than the anode.

Positive ions generated in a region adjacent to the filament 940 may be incident on the filament 940. Those positive ions may collide against the filament 940, which may cause a sputtering etch effect on the filament 940. The sputtering etch effect may degrade the filament 940, resulting in a short, and may shorten the life span and/or endurance of the filament 940. Degradation of the filament 940 also may cause an increase in preventive maintenance cost and/or repair.

The sputtering etch effect may be higher when the positive ions are incident on the surface of the filament 940 at an angle of around 30° through 60°. Accordingly, the filament 940, may be shaped as a wire, for example a pig's tail, as shown in FIG. 2. The majority of the positive ions may collide with the filament 940 at an angle of around 30° through 60°.

Further, as aforementioned, because the thermions emitted from the filament 940 may be more abundant around the cathode, more positive ions may be generated in regions adjacent to the cathode. Thus, positive ions applied onto the filament 940 may increase around the cathode, increasing the sputtering etch effect at those regions thereof.

Therefore, if the filament is shorted due to the sputtering etching effect, the ion implantation equipment may have to be shut off to replace the shorted filament.

Moreover, using the conventional filament, electrons emitted from the filament may partially discharge and collide with a sidewall of the arc chamber, thereby damaging the arc chamber.

SUMMARY

Example embodiments may be directed to a filament member capable of more uniformly emitting thermions.

Example embodiments may be directed to a filament member having a structure with an increased lifetime by lowering a sputtering etch effect.

Example embodiment may be directed to a filament member capable of continuous operation even when one or more current paths may be shorted by a sputtering etch effect.

Example embodiment may be directed to a filament member capable of preventing electrons, which may be discharged from the filament member, from colliding with a sidewall of an arc chamber in an ion source.

In an example embodiment, a filament member configured to discharge thermions may include an anode disposed around a central portion of the filament member, a cathode disposed around a periphery of the filament and/or configured to enclose the anode, and at least one conductive path disposed between the anode and the cathode to discharge the thermions.

BRIEF DESCRIPTION OF THE DRAWINGS

Non-limiting and non-exhaustive example embodiments will be described with reference to the following drawings, wherein like reference numerals may refer to like parts throughout the various drawings unless otherwise specified. In the drawings.

EXAMPLE EMBODIMENTS

Figure 1:
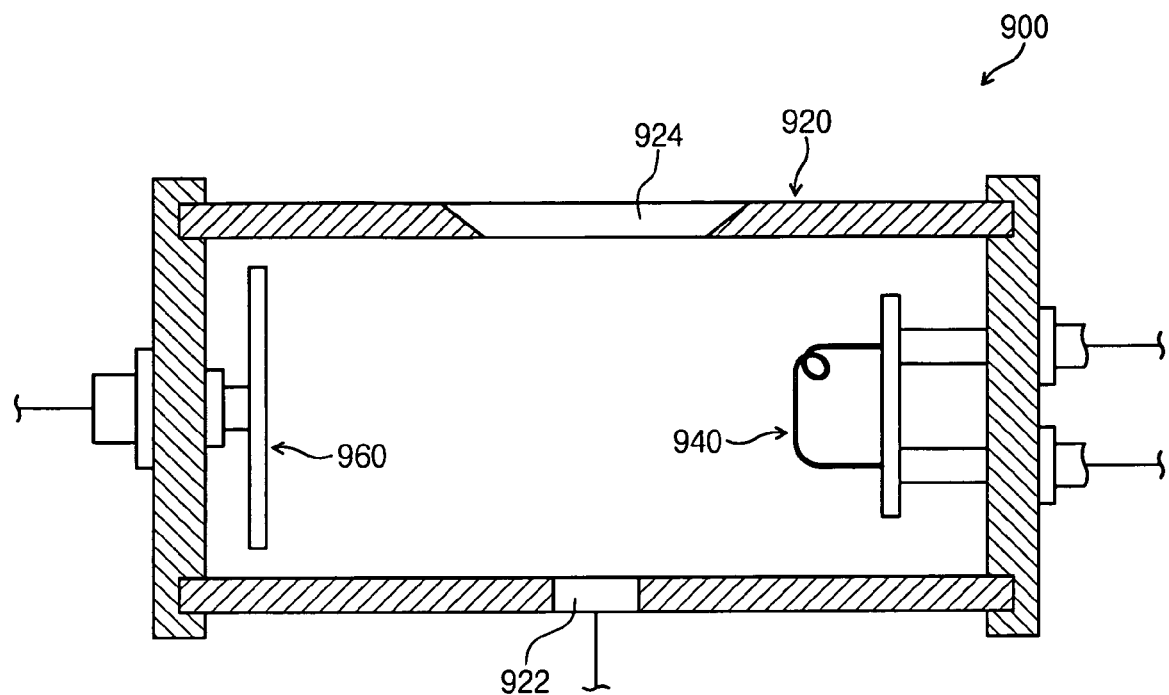
FIG. 1 is a sectional view schematically illustrating a conventional ion source.
Figure 2:
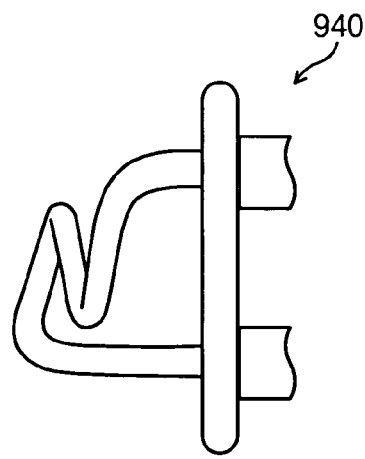
FIG. 2 is a perspective view illustrating a conventional filament.

Example embodiments will be described below in more detail with reference to the accompanying drawings. Example embodiments may, however, be embodied in different forms and should not be constructed as limited to example embodiments set forth herein. Rather, example embodiments are provided so that this disclosure will be thorough, and will convey the scope of the example embodiments to those skilled in the art.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described with reference to FIGS. 3 through 12. Dotted lined in FIGS. 6, and 9 through 12 illustrate current paths in filaments.

Figure 3:
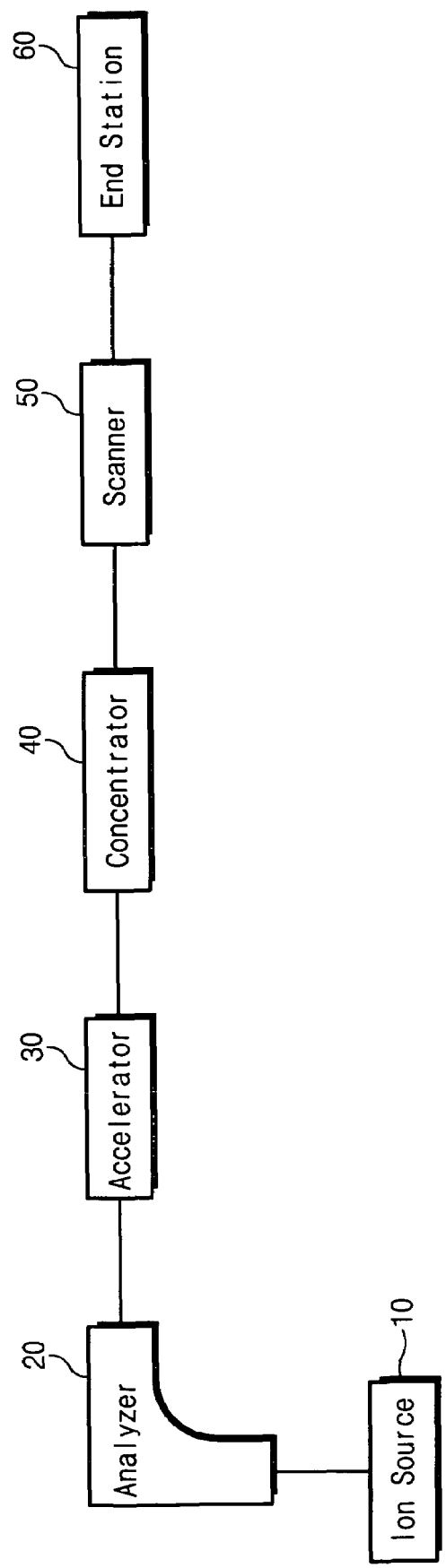
FIG. 3 is a schematic view illustrating an example embodiment of an ion implantation apparatus.

With reference to FIG. 3, an ion implantation apparatus 1 may include an ion source 10, an analyzer 20, an accelerator 30, a concentrator 40, a scanner 50, and an end station 60.

Ions may be generated from the ion source 10. Ions with sufficient atomic weights required for implanting a wafer therein may be selected. The ions selected by the analyzer 20 may be accelerated up to an energy level capable of injecting them into a wafer to a desired depth by way of the accelerator 30. Neutral atoms may be ionized to allow positive ions to move in a cluster, and ion beams may be focused on the concentrator 40 to prevent the ion beams from spreading away by a repulsive force thereof. To more uniformly distribute the ion beams over the wafer, a progressing direction, for example, in the vertical direction, of the ion beams may be controlled by the scanner 50 and thereby the ions may be injected into the wafer at the end station 60.

Figure 4:
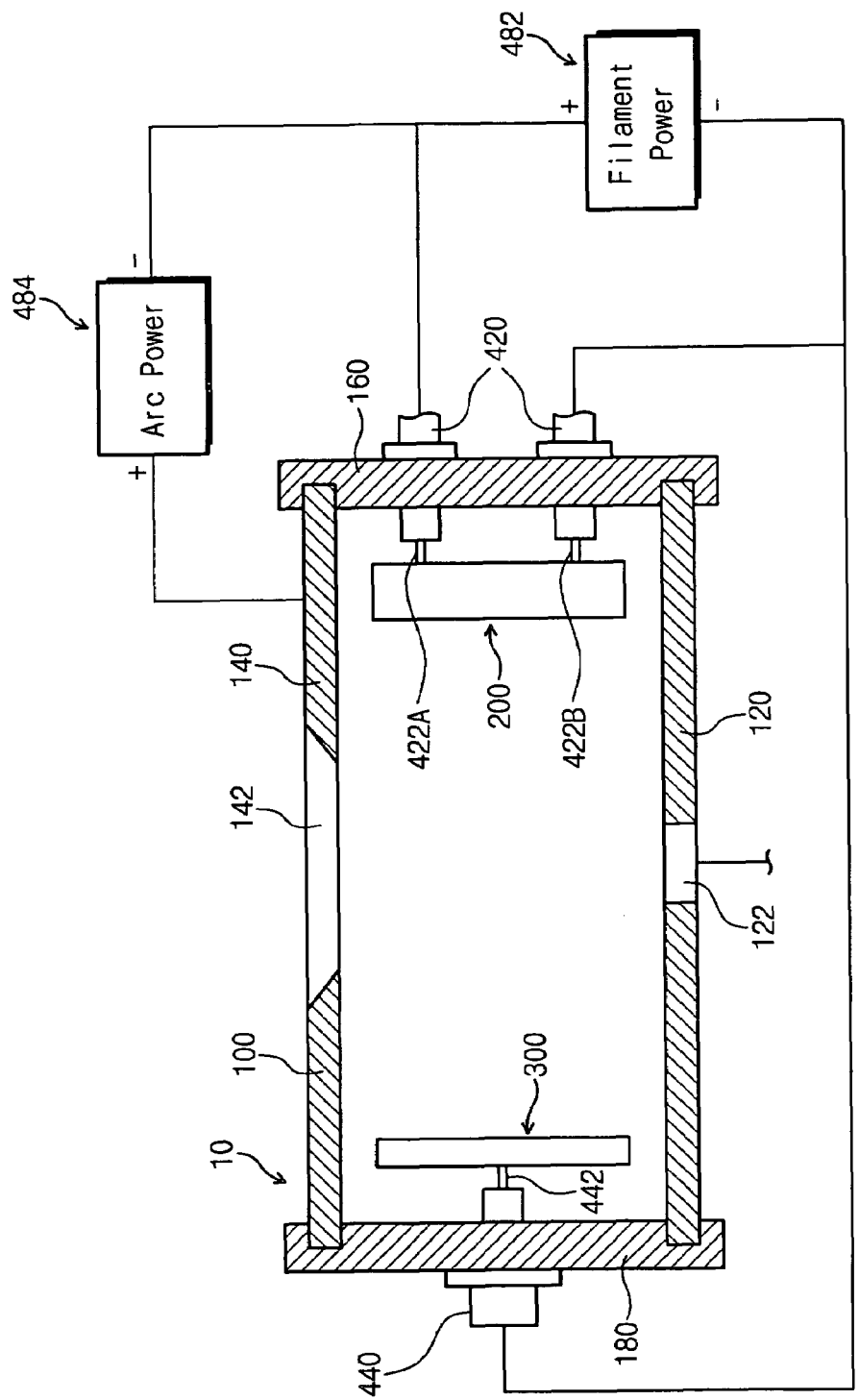
FIG. 4 is a sectional view illustrating an example embodiment of an ion source.

FIG. 4 is an example sectional view illustrating the ion source 10 illustrated in FIG. 3. Referring to FIG. 4, the ion source 10 may include an arc chamber 100, a filament member 200, and/or a repeller 300.

The arc chamber 100 may be rectangular shaped and include a first sidewall 120, a second sidewall 140, a third sidewall 160, and a fourth sidewall 180. Because the arc chamber 100 is a three-dimensional chamber, it should be noted that the arc chamber 100 may also have a fifth sidewall (not shown) and a sixth sidewall (not shown). The first sidewall 120 may be opposite to the second sidewall 140, and the third sidewall 160 may be opposite to the fourth sidewall 180. The third and fourth sidewalls 160 and 180 may be disposed vertical to the first and second sidewalls 120 and 140. An inflow port 122 may be located on the first sidewall 120 to introduce source gas into the arc chamber 100. At the second sidewall 140, a beam outlet 142 may be used to emit positive ions generated within the arc chamber 100. The inflow port 122 may be formed in a circular shape and the outlet 142 may be formed in a slit shape. The arc chamber 100 may be supplied with a positive voltage from an arc power supply 484.

The filament member 200 and the repeller 300 may be arranged in the arc chamber 100 opposite to each other. The filament member 200 may be disposed near and in parallel with the third sidewall 160. The repeller 300 may be disposed near and in parallel with the fourth sidewall 180. The filament member 200 may discharge thermions into the arc chamber 100 to ionize source gas into positive ions and electrons within the arc chamber 100.

The repeller 300 may be supplied with a negative power voltage. The repeller 300 may force non-reacted thermions to move toward the source gas. The filament member 200 may be supported by a filament fixing block 420, and the repeller 300 may be supported by a repeller fixing block 440. The filament fixing block 420 may be made of a dielectric material. The filament fixing block 420 may penetrate the third sidewall 160 and insulate the filament member 200 from the arc chamber 100. A conductive projection may include an anode conductive projection 422A and a cathode conductive projection 422B and may be provided to contact the filament member 200. The anode conductive projection 422A and a cathode conductive projection 422B may be supplied with a filament current from a filament power source 482. The repeller fixing block 440 may be made of a dielectric material. The repeller fixing block 440 may penetrate the fourth sidewall 180 and insulate the repeller 300 from the arc chamber 100. A conductive projection 442 may be provided with the repeller fixing block 440 to contact the repeller 300.

The filament member 200 illustrated in FIG. 4 will be described with reference to FIGS. 5 through 7.

Figure 5:
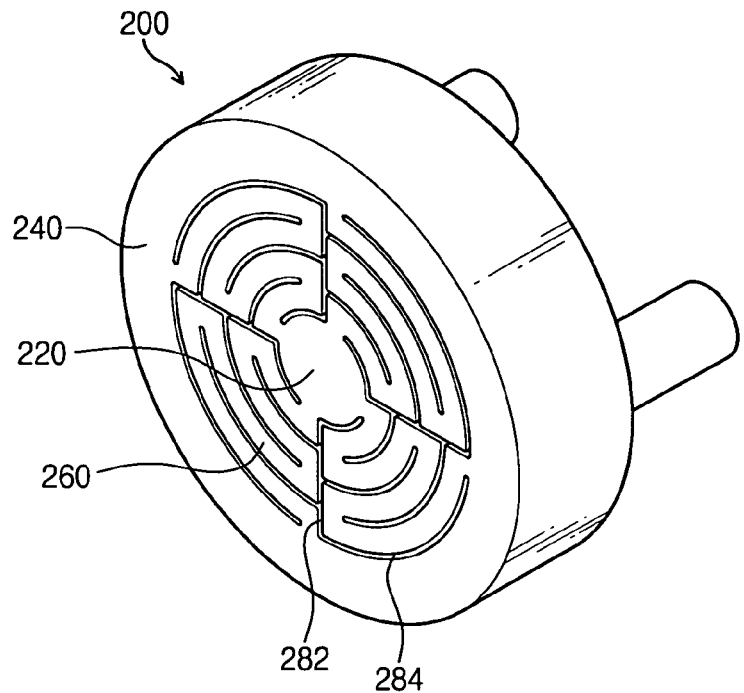
FIG. 5 is a perspective view illustrating an example embodiment of the filament member.

FIG. 5 illustrates an example embodiment of the filament member 200 illustrated in FIG. 4. FIG. 6 is a front view of the filament member 200 illustrated in FIG. 5, and FIG. 7 is a sectional view taken along the line I-I' of FIG. 6. The filament member 200 may be made of tungsten (W), and may include an anode 220, a cathode 240, and at least one conductive path 260. The anode 220 may be disposed at a center of the filament member 200, and the cathode 240 may be disposed at a peripheral edge of the filament member 200. Between the anode 220 and the cathode 240, at least one conductive path 260 may be provided, wherein thermions may be discharged therefrom. One end of the conductive path 260 may be connected to the cathode 240 and the other end may be connected to the anode 220.

According to an example embodiment, the anode 220 may be formed in a pattern of a circle (an example shape), and the cathode 240 may be in a ring-shape (also, an example shape). The anode 220 and the cathode 240 may be centered near the same point. The anode 220 and the cathode 240 should be of sufficient diameter size and width to prevent emission of thermions from the anode 220 and cathode 240. The conductive paths 260 may be designed to be narrower in width relative to those of the anode 220 and cathode 240.

According to other example embodiments the positions of the anode 220 and the cathode 240 may be reversed, namely, the anode 220 (with its varying shapes) may be disposed at a peripheral edge of the cathode 240.

The anode 220 may be connected to the conductive projection 422A, which may be coupled to the positive electrode of the filament power source 482. The cathode 240 may be connected to the conductive projection 422b, which may be coupled to the negative electrode of the filament power source 482. The (one or more) conductive paths 260 may be interposed between the anode 220 and the cathode 240. The (one or more) conductive paths 260 may be arranged in a radial pattern. For example, a space between the anode 220 and the cathode 240 may be sectored into a plurality of regions and the (one or more) conductive paths 260 may be provided in each of the regions. The conductive paths 260 may be arranged in zigzag pattern with arcs centered on the anode 220. For example, the conductive paths 260 may have the same center of curvature, but a length of a radius may be different. In each of the plurality of regions, the conductive paths 260 may link with each other at adjacent ends so as to provide a united route. The conductive paths 260 may be symmetric with respect to the anode 220.

Figure 6:
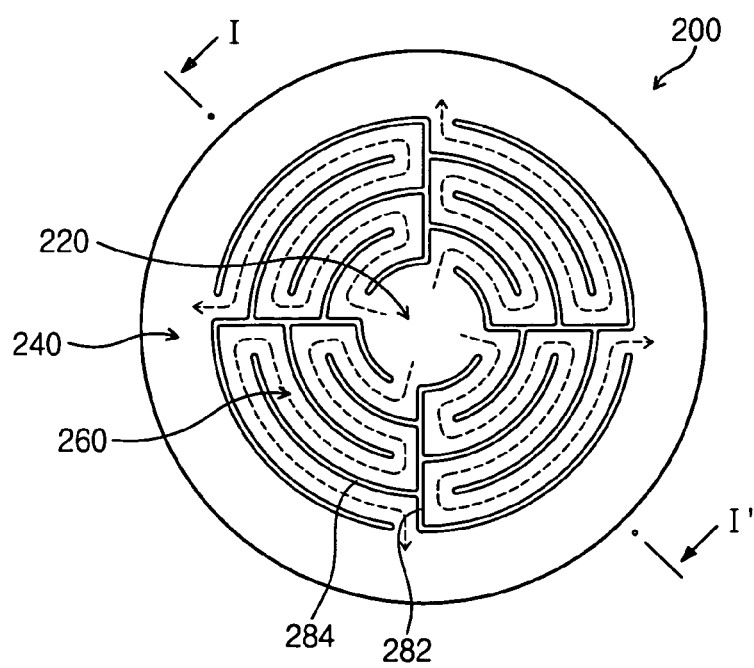
FIG. 6 is a front global view of the filament member illustrated in FIG. 5.

According to an example embodiment, as illustrated in FIG. 6, the filament member 200 may have four conductive paths 260. The space between the anode 220 and the cathode 240 may be sectored into four fan-shaped regions, each of which is provided with the conductive paths 260 symmetric with respect to the anode 220.

As the conductive paths 260 may be arranged toward the edge regions (the cathode 240) from the center region (the anode 220), thermions may be discharged more uniformly throughout the filament member 200.

Because the filament member 200 may have a plurality of conductive paths 260, an ion implantation apparatus may continue to operate without interruption even when one of the conductive paths 260 may be shorted due to the sputtering etch effect.

Although the anode 220, the cathode 240, and the at least one conductive path 260 may be made of tungsten, the anode 220 and cathode 240 may be formed of other metals. However, the materials of the anode 220 and cathode 240 should be strong enough to resist the sputtering etch effect because the anode 220 and cathode 240 may be eroded by positive ions.

Figure 7:
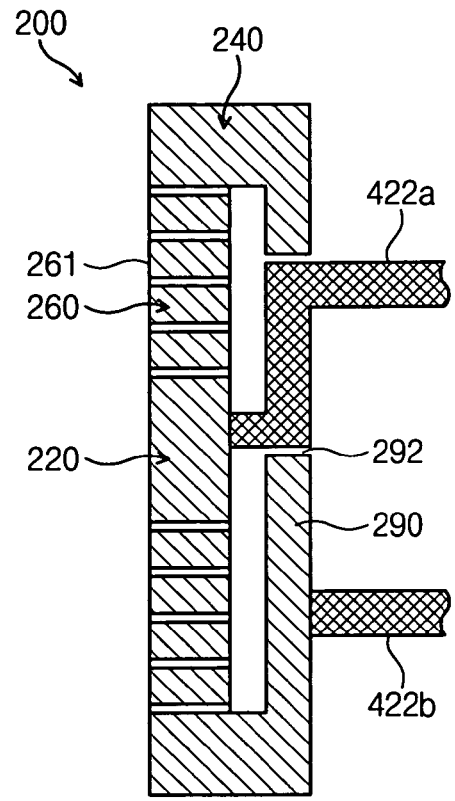
FIG. 7 is a sectional view taken along the line I-I' of FIG. 6.

Referring to FIG. 7, the filament member 200 may further include a negative plate 290. The negative plate 290 may be disposed between the conductive paths 260 and the third sidewall 160. The negative plate 290 may be round in shape and joined to the cathode 240. The negative plate 290 may also be provided separate from the cathode 260. The negative plate 290 may force thermions toward the source gas (e.g., toward the fourth sidewall 180) from the conductive paths 260. The negative plate 290 may include a hollow section 292 into which the conductive projection 422A connected to the anode 220 may be inserted.

The conductive paths 260 may be configured with a flat front face 261 opposite to the region through which the processing gas flows into the arc chamber 100. The flat front face 261 may guide the positive ions vertically into the conductive paths 260 when positive ions generated from regions adjacent to the conductive paths 260 collide with the conductive paths 260. The flat front face 261 may reduce an etch rate of the sputtering etch effect. According to an example embodiment, as illustrated in FIG. 7, each of the conductive paths 260 may have a rectangular section. The conductive paths 260 may also be configured to have a polygonal section.

As illustrated in FIGS. 7A and 7B, in example embodiments, the anode 220 and at least one of the conductive paths 260 and/or the cathode 240 and at least one of the conductive paths 260 are coplanar; that is a plane exists in a direction substantially parallel to a major axis of the filament member 200 that cuts through the anode 220 and at least one of the conductive paths 260 and/or the cathode 240 and at least one of the conductive paths 260.

Figure 8B:
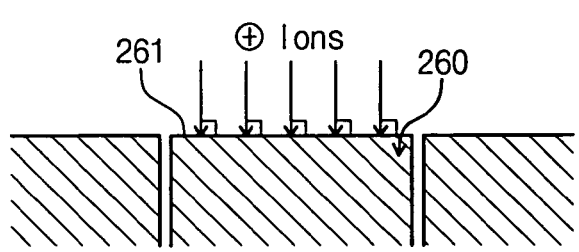
FIGS. 8A and 8B illustrate incident angles of positive ions with respect to conductive paths having a round surface and a flat front face, respectively.
Figure 8A:
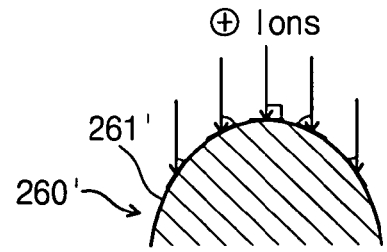

FIGS. 8A and 8B illustrate incident angles of positive ions with respect to a conductive path 260' having a circular section and a conductive path 260 having a flat front face 261, respectively. As illustrated in FIG. 8A, when the conductive path 260' is configured to have a round surface 261', for example, a circular section, most of the positive ions collide with the surface 261' at an angle, which may cause the sputtering etch effect to increase. On the contrary, as illustrated in FIG. 8B, when the conductive path 260 is configured to have a flat or substantially flat front face 261, most of positive ions collide perpendicularly or substantially perpendicularly with respect to the surface 261, which may reduce the sputtering etch effect.

An example embodiment of manufacturing a filament member 200 will now be described. A circular main body made of tungsten may be prepared. Outer boundaries 282 (shown in FIGS. 5-6 and 9A-9C) may be formed outwardly from a center of the circular main body to an edge thereof. The outer boundaries 282 may be arranged in regular intervals. Between the center and edge of the filament member 200, fan-shaped regions may be provided in the same number with the boundaries 282. Each of the fan-shaped regions may be between two adjacent outer boundaries 282.

A plurality of inner boundaries 284 (shown in FIGS. 5 and 9A-9C) may be formed in the shape of arcs centered on an anode 220. One end of an inner boundary 284 may be linked with one of the outer boundaries 282, while another end of an inner boundary 284 may be isolated from the other one of the outer boundaries 282 in the fan-shaped region. The plurality of inner boundaries 284 may be arranged in the same interval, but, the plurality of inner boundaries 284 may be different from each other in each interval for the purpose of selectively emitting thermions in accordance with regional requirements. Processing the filament member 200 may be accomplished by means of a high-temperature die casting, electrical discharge machining, and/or wire cutting.

The (one or more) conductive paths 260 may be formed to have an extended length by the method described above to increase the amount of thermions discharged, thereby enhancing the efficiency of ionizing the source gas.

Figure 9A:
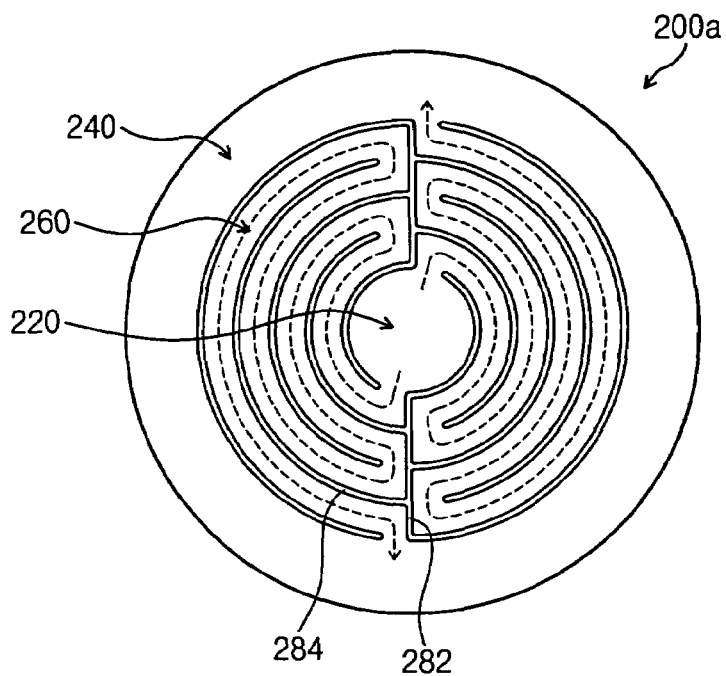
FIGS. 9A through 9C, 10, 11, and 12A and 12B are front views illustrating example embodiments of the filament member.
Figure 9B:
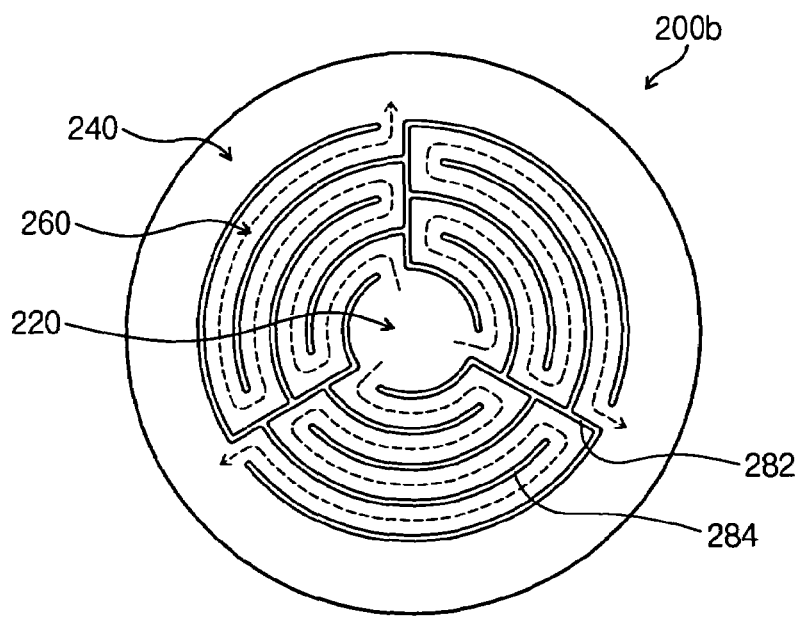
Figure 9C:
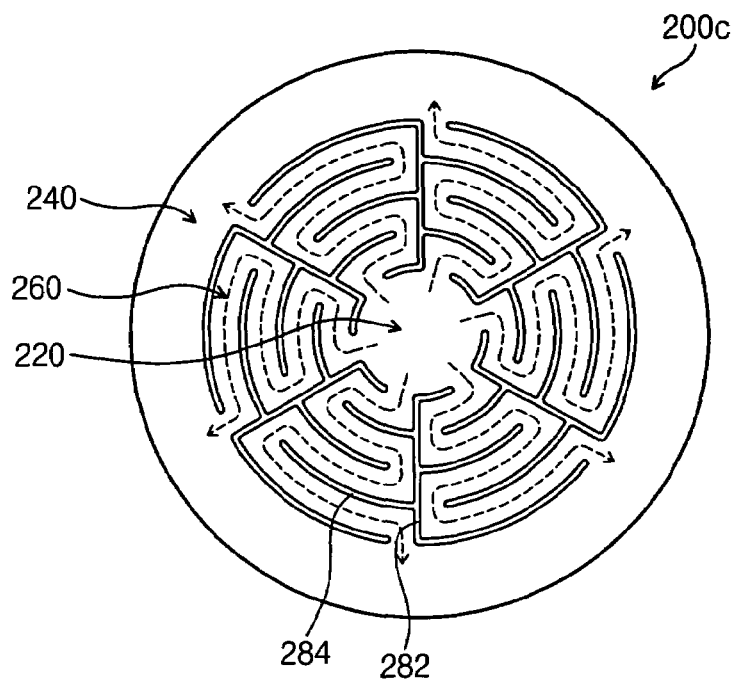

Although FIG. 6 illustrates a filament member 200 having four conductive paths 260, a filament member according other example embodiments may be configured with conductive paths in various numbers. For example, FIG. 9A illustrates a filament member 200a having two regions of conductive paths 260; FIG. 9B illustrates a filament member 200b having three regions of conductive paths 260; and FIG. 9C illustrates a filament member 200c having six regions of conductive paths 260.

According to another example embodiment, a cathode 240 may be formed to enclose the conductive paths 260 to sufficiently prevent emission of thermions therefrom. The thermions from the conductive paths 260 may be discharged toward a fourth sidewall 180, without being forwarded directly to first and second sidewalls 120 and 140. Example embodiments may be effective in preventing the first and second sidewalls 120 and 140 of the arc chamber 100 from being damaged due to collision with thermions.

Figure 10:
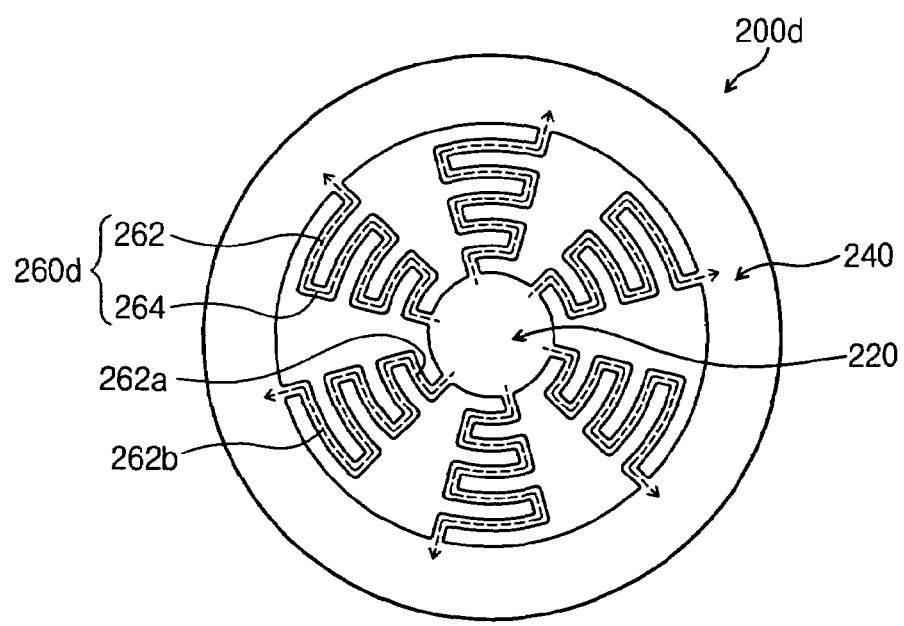

FIG. 10 illustrates another filament member 200d. In FIG. 10, the filament member 200d may include conductive paths 260d. The filament member 200d may have six units of a conductive path 260d. The conductive paths 260d may be arranged in a radial shape. The conductive paths 260d may be connected with the anode 220, which may be disposed at a center of the filament member 200d. A ring-shaped cathode 240 may be disposed at an edge of the filament member 200d. Each of the conductive paths 260d may include a first portion 262 extending along a first direction and a second portion 264 extending along a second direction. The first portion 262 may be shaped in arcs centered on the anode 220, and/or in a straight line as being normal lines on the arcs. The second portion 264 may be configured in a straight line along a radius of the anode 220. The second 264 portion may link the innermost line 262a of the first lines 262 with the anode 220, or link the outermost line 262b of the first portion 262 with the cathode 240, so as to unite the conductive paths 260d in a single line as a whole. The first portion 262 may be formed in similar lengths with each other or longer outward from the anode 220. The second portion 264 may be almost similar to each other in length.

Figure 11:
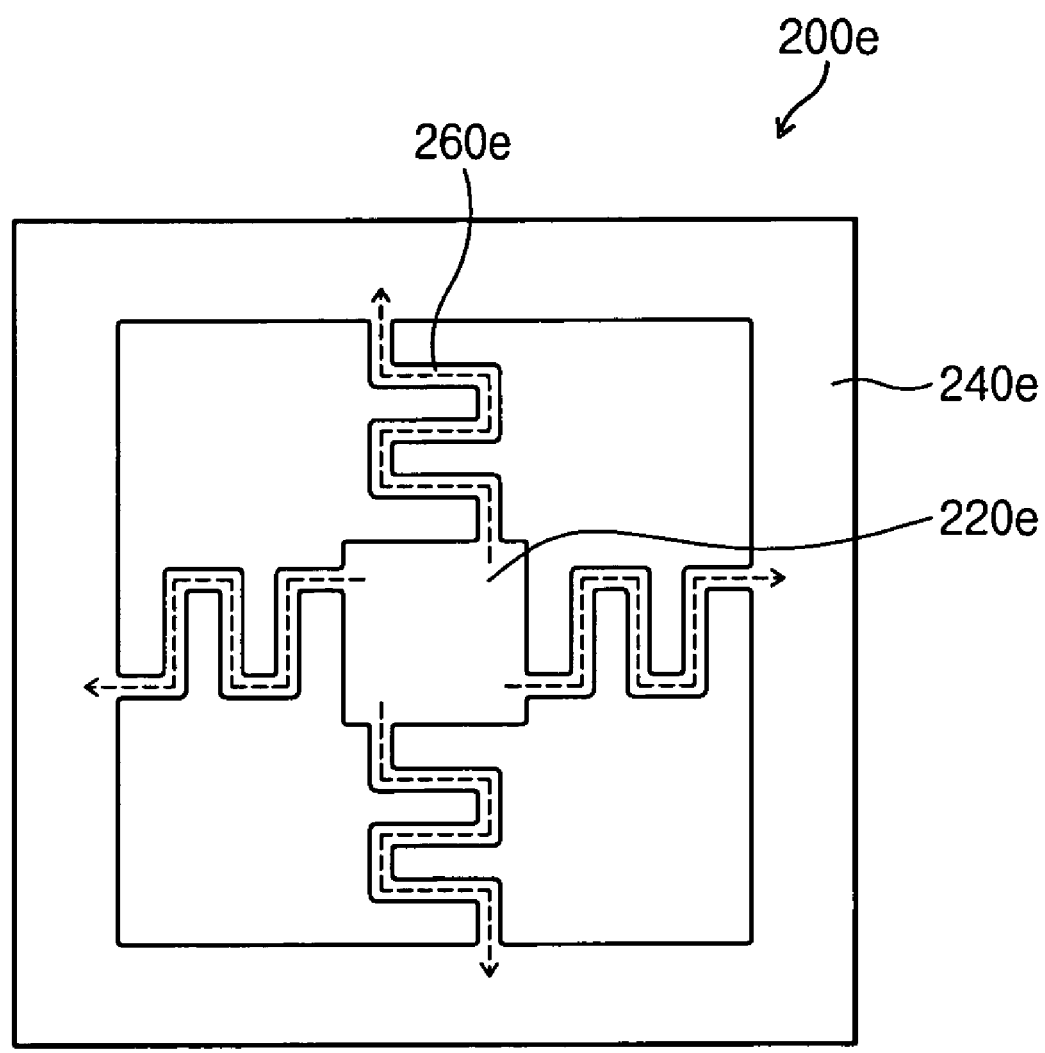

As illustrated in FIG. 11, a filament member 200e may have a rectangular shape including a rectangular anode 220e and a square-ring cathode 240e. Conductive lines 260e may be formed similar to the conductive lines 260d illustrated in FIG. 10.

Figure 12A:
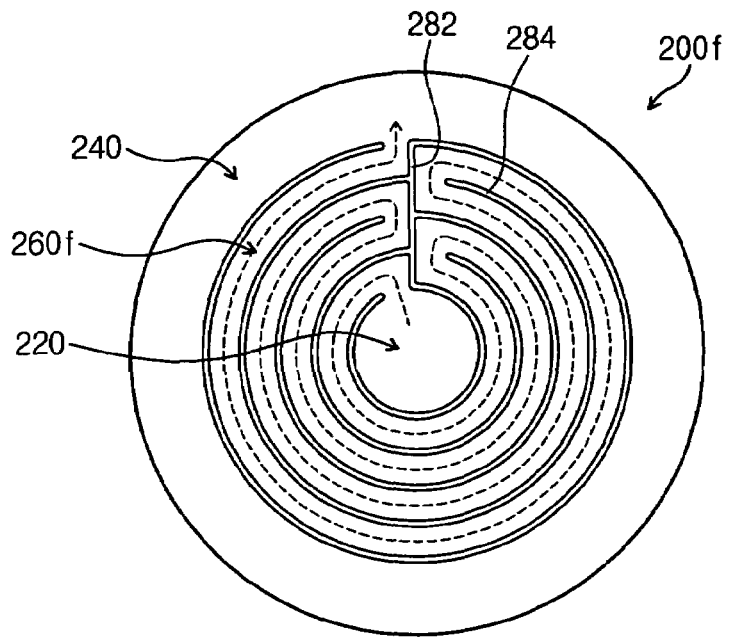
Figure 12B:
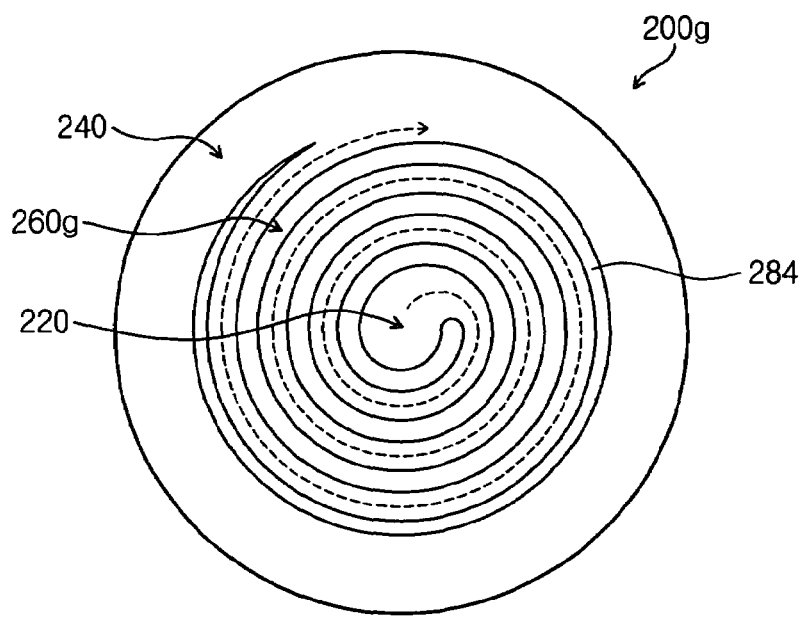

FIGS. 12A and 12B further illustrate filament members 200f and 200g, respectively. Referring to FIG. 12A, the filament member 200f may include a circular anode 220 and a ring-shaped cathode 240, which may enclose the anode 220. A single conductive path 260f may be provided between the anode 220 and the cathode 240. As further illustrated in FIG. 12A, the conductive path 260f may be formed of a plurality ring-shaped lines connected with each other. Ends of the ring-shaped lines may be isolated from each other on the outer boundary 282. The ring-shaped lines may be centered at the same position and extend outwardly. The other ends of adjacent lines are connected with each other, providing the conductive paths 260f as a single body.

A method of forming the filament member 200f illustrated in FIG. 12A is described as follows. A tungsten main body shaped in circle may be prepared. Outer boundaries 282 may be formed along a radius direction from a position around the circular center of the main body toward a position of a ring-shaped edge. The central area of the main body may be provided with the anode 220, while the edge thereof may be provided with the cathode 240. A plurality of inner boundaries 284 may be disposed between the anode 220 and the cathode 240. The plurality of inner boundaries 284 may be different in radius, parts of which may be provided in several forms. One end of the plurality of inner boundaries 284 may be joined with the outer boundary 282, while the other end may be isolated from the outer boundaries 282.

Although FIG. 12A illustrates a single conductive path 260f composed of the plurality ring-shaped lines of differing radius, another example embodiment may be as illustrated in FIG. 12B. The filament member 200g of FIG. 12B may include a single conductive path 260g that may be shaped in a spiral moving outwardly from a center, for example, the anode 220.

According to example embodiments, a filament member may more uniformly emit thermions. The life-span of the filament member may be increased by lowering a sputtering etch effect. In addition, the filament member may continuously operate even when one of the current paths is shorted by a sputtering etch effect. Moreover, example embodiments may prevent electrons, which may be discharged from the filament, from colliding with sidewalls of an arc chamber.

The above-disclosed subject matter may be considered illustrative, and not restrictive, and the appended claims are intended to cover all such modifications, enhancements, and other embodiments, which fall within the scope of the example embodiments.

What is claimed is:

1. A filament member, comprising:
an anode disposed around a central portion of the filament member;
a cathode disposed around a periphery of the filament member and configured to enclose the anode; and
at least one conductive path disposed between the anode and the cathode to discharge thermions, wherein at least two of the cathode, the anode, and the at least one conductive path are coplanar.

2. The filament member as set forth in claim 1, wherein the at least one conductive path is a radial path.

3. The filament member as set forth in claim 1, wherein the at least one conductive paths is a zigzag path.

4. The filament member as set forth in claim 1, further comprising a plurality of outer boundaries and a plurality of inner boundaries, wherein the plurality of outer boundaries extend from around the anode toward the cathode, and each of the plurality of outer boundaries includes the plurality of inner boundaries extending in an arc.

5. The filament member as set forth in claim 4, wherein a region between two adjacent outer boundaries is fan-shaped, each of the fan-shaped regions configured to include the at least one conductive path.

6. The filament member as set forth in claim 5, wherein each of the at least one conductive paths is identical.

7. The filament member as set forth in claim 1, further comprising a single outer boundary and a plurality of inner boundaries, wherein the single outer boundary extends from around the anode towards the cathode, and the single outer boundary includes the plurality of inner boundaries extending in an arc.

8. The filament member as set forth in claim 1, wherein a shape of the filament member, the anode, and the cathode is polygonal, and the at least one conductive path is arranged in a zigzag path.

9. The filament member as set forth in claim 1, wherein a shape of the filament member, the anode, and the cathode is circular.

10. The filament member as set forth in claim 1, wherein the cathode, the anode, and the at least one conductive path include tungsten.

11. An ion source comprising:
the filament member as set forth in claim 1;
an arc chamber including an inflow port configured to introduce source gas and a beam outlet configured to externally emit ions generated in the arc chamber;
an arc power supply to supply power to the arc chamber; and
a filament power source to supply power to the filament member.

12. The ion source as set forth in claim 11, wherein the arc chamber comprises a repeller disposed on an opposite side of the filament member.

13. The ion source as set forth in claim 11, wherein the filament member further includes a negative plate disposed between the at least one conductive path and a side wall of the arc chamber.

14. The filament member as set forth in claim 13, wherein the arc chamber includes a negative conductive projection connected to the cathode, and a positive conductive projection connected to the anode.

15. The filament member as set forth in claim 14, wherein the negative plate includes a hollow section into which the positive conductive projection is inserted.

16. An ion implantation apparatus comprising:
the ion source as set forth in claim 11;
an analyzer configured to select ions from the ion source; and
an accelerator configured to accelerate the selected ions into a wafer.

17. The ion implantation apparatus as set forth in claim 16, wherein the ion implantation apparatus further comprises:
a concentrator configured to preventing the ions from spreading;
a scanner configured to control a vertical direction of the ions; and
an end station configured to hold the wafer for ion injection.

* * * * *